(12) United States Patent
Oremus

(10) Patent No.: US 9,558,984 B2
(45) Date of Patent: Jan. 31, 2017

(54) DEVICE FOR HOLDING A PLANAR SUBSTRATE

(75) Inventor: Alexander Oremus, Villach (AT)

(73) Assignee: Mechatronic Systemtechnik GmbH, Villach (AT)

( * ) Notice: Subject to any disclaimer, the term of this patent is extended or adjusted under 35 U.S.C. 154(b) by 326 days.

(21) Appl. No.: 14/130,349

(22) PCT Filed: Jul. 2, 2012

(86) PCT No.: PCT/AT2012/050092
§ 371 (c)(1),
(2), (4) Date: Mar. 21, 2014

(87) PCT Pub. No.: WO2013/003877
PCT Pub. Date: Jan. 10, 2013

(65) Prior Publication Data
US 2014/0191478 A1 Jul. 10, 2014

(30) Foreign Application Priority Data
Jul. 1, 2011 (AT) .................................. A 969/2011

(51) Int. Cl.
*H01L 21/683* (2006.01)
*H01L 21/673* (2006.01)
*H01L 21/687* (2006.01)

(52) U.S. Cl.
CPC ..... *H01L 21/6838* (2013.01); *H01L 21/67376* (2013.01); *H01L 21/687* (2013.01);
(Continued)

(58) Field of Classification Search
CPC ........... H01L 21/6838; H01L 21/67376; H01L 21/687; H01L 27/68714; H01L 21/68735; H01L 21/68742; H01L 21/6875; Y10T 279/11
See application file for complete search history.

(56) References Cited

U.S. PATENT DOCUMENTS 6,517,130 B1  2/2003 Donoso et al.
2003/0008602 A1  1/2003 Ashjaee et al.
(Continued)

FOREIGN PATENT DOCUMENTS

EP   0 860 861 A1   8/1998
JP   S57-177536 A   11/1982

OTHER PUBLICATIONS

International Search Report of PCT/AT2012/050092, mailed Oct. 2, 2012.

*Primary Examiner* — Eric A Gates
*Assistant Examiner* — Paul M Janeski
(74) *Attorney, Agent, or Firm* — Collard & Roe, P.C.

(57) ABSTRACT

A device (1) for holding a planar substrate (4), in particular for a wafer or an eWLB, is shown, with a support (2) which forms a supporting surface (3) for the substrate (2) and has at least one recess (5) provided in the region of the supporting surface (3) for the substrate (2), and with at least one holding means which is connected in terms of flow to said recess (6) and is intended for fixing the substrate (2) on the device (1) with the aid of a vacuum generated between the support (2) and substrate (4). In order to be able to grip a multiplicity of substrates of geometrically differing profile, it is proposed that the support (2) has at least one recess (6) with an elastic seal (7) which is designed to be movable from a position (9) protruding over the edge (8) of the recess (6) into a position (10) pulled back in relation to the edge (8) of the recess (6) or at most corresponding to said edge and which interacts with the recess (5) for sucking the full area of the substrate (4) onto the support (2).

15 Claims, 4 Drawing Sheets

(52) U.S. Cl.
CPC .... *H01L 21/6875* (2013.01); *H01L 21/68714* (2013.01); *H01L 21/68721* (2013.01); *H01L 21/68735* (2013.01); *H01L 21/68742* (2013.01); *Y10T 279/11* (2015.01)

(56) References Cited

U.S. PATENT DOCUMENTS

| | | |
|---|---|---|
| 2007/0026772 A1 | 2/2007 | Dolechek et al. |
| 2010/0013169 A1 | 1/2010 | Monteen et al. |

DEVICE FOR HOLDING A PLANAR SUBSTRATE

CROSS REFERENCE TO RELATED APPLICATIONS

This application is the National Stage of PCT/AT2012/050092 filed on Jul. 2, 2012, which claims priority under 35 U.S.C. §119 of Austrian Application. No. A 969/2011 filed on Jul. 1, 2011, the disclosures of which are incorporated by reference. The international application under PCT article 21(2) was not published in English.

TECHNICAL FIELD

The invention relates to an apparatus for holding a planar substrate, particularly for a wafer or eWLB, having a support that forms a supporting surface for the substrate, which has at least one recess provided in the region of the supporting surface for, the substrate, and having at least one holding means connected with this recess, in terms of flow, for fastening the substrate onto the apparatus, using a partial vacuum generated between support and substrate.

STATE OF THE ART

"Vacuum chucks" or holders for wafers or other substrates are known from the state of the art (US2010/0013169A1), which bind these items or hold them in place on their support, using a partial vacuum. Often, these also fulfill the task of pulling the substrates into a planar dimension. For this purpose, the supporting surface of the support has recesses that are connected with holding means, in terms of flow, to generate a partial vacuum. In this way, warped substrates can be pulled to be planar—substrates that are comparatively highly warped are additionally impacted with compressed air, in order to press them onto the supporting surface and thereby to allow full-area suction of the substrates onto the holder. Such compressed-air designs are complicated in design and furthermore have an increased risk of contamination of the pressure-impacted substrate surface, which can disadvantageously lead to damage of the wafers of eWLBs ("embedded Wafer Level Ball Grid Array").

Furthermore, suction cups for holding wafers are known (U.S. Pat. No. 6,517,130B1), which are mounted in a recess of a support that forms a supporting surface. These suction cups are connected to a partial vacuum source and can pull back below the edge of the supporting surface with their cup seal. Comparatively highly warped substrates cannot be drawn against the supporting surface by suction, over their full area, with this, and this restricts the usability of the suction cups.

PRESENTATION OF THE INVENTION

The invention has therefore set itself the task of improving an apparatus for holding a planar substrate, of the type described initially, in such a manner, with a simple design, that comparatively highly warped substrates can be brought into a specific shape with it, and that nevertheless, in this connection, the risk of damage to the substrates remains small.

The invention accomplishes the stated task in that the support has at least one recess having an elastic seal, which is configured so that it can be moved from a position projecting beyond the edge of the recess into a position pulled back in relation to the edge of the recess or at most coinciding with it, and which works together with the recess to draw the substrate against the support over its full area, by suction.

If the support has at least one recess having an elastic seal, which is configured so that it can be moved from a position projecting beyond the edge of the recess into a position pulled back in relation to the edge of the recess or at most coinciding with it, then the risk of damage to the substrate as the result of possible point-by-point deformation of the substrate in the region of the seal can be kept slight, because the seal can pull back under the supporting surface or the edge of the recess when the substrate is drawn onto the supporting surface by means of partial vacuum. If this seal now additionally works together with the recess to draw the substrate against the support over its full area, by suction, even a substrate that deviates comparatively greatly from the desired geometrical shape can be accommodated by the apparatus or holder by means of the projecting seal, and held in place sufficiently. This is because the seal can thereby equalize or bridge distances between supporting surface and substrate, and can ensure a gas-tight sealing effect. Even comparatively great bending (bow), waviness (warp), deviations in levelness (flatness) and/or thickness deviations (Total Thickness Variation) of the substrate can be equalized in this manner, thereby making it possible to guarantee a secure hold of the substrate on the apparatus. In addition, even great geometrical deviations cannot prevent the substrate from being drawn against the support over its full area, by suction, so that all kinds of substrates can be brought into a desired dimension that is predetermined by the support. The apparatus can therefore be characterized, in particular, as compared with the state of the art, in that a comparatively great geometrical tolerance capacity can be utilized in simple design manner, with reduced risk of damage to the sensitive substrate side, and it is nevertheless possible to bring or straighten substrates into a desired shape, which can be drawing them flat and/or also leveling them, for example. This can be comparatively advantageous particular in the case of warped or bent substrates.

In general, it is pointed out that the seal can also be provided in a recess that is connected with holding means in terms of flow, in order to generate a partial vacuum between substrate and support. A recess can therefore fulfill two technical functions, on the one hand a holding function and on the other hand also a technical function with regard to what was explained above. Furthermore, it is mentioned in general that wafers can be understood to be circular or square substrates for electronic components, among other things for microelectronic, photovoltaic and/or micro-system technology. The term wafer can therefore also include artificially produced wafers, such as WLB, eWLB or the like, for example.

Design simplicity can result if the elastic seal is configured so that it can be passively moved by the substrate, particularly since the movement forces for dipping the seal into a position that is disruption-free for the shape of the substrate can be generated at the same time with drawing the substrate in by suction. Preferably, the recesses are disposed distributed over the support, in order to thereby be able to improve full-area drawing-in of the substrate by suction. Furthermore, in this way a locally increased mechanical stress of the substrates during drawing-in by suction can be kept low. A particularly robust apparatus can be created in this manner.

Particularly advantageous suction conditions can result if the recess has a closed contour progression with the seal.

Particularly advantageous conditions for fastening the substrate on the apparatus can result if the seal essentially surrounds the recess of the support that has the partial vacuum. Likewise, in this way the tolerance of the apparatus with regard to deformed, for example warped or bent substrates can be increased, because enlarged sealing surfaces can form an expanded gas-tight connection with the substrate. If the seal completely surrounds the recess for drawing the substrate in by suction, then a closed suction region can be made possible, so that even in the case of comparatively greatly deformed substrates, secure fastening can become possible with reduced pressure conditions. The apparatus is therefore not only particularly robust with regard to deviations in the geometry of the substrate, but can also avoid damage to the substrate with reduced stresses.

The tolerance with regard to geometrical deviations of the substrate can be further increased if the recess for the seal divides the supporting surface into two supporting surface portions.

If the recess for the seal follows an edge-side supporting surface portion, then the substrate can be brought into a desired shape all the way into its edge region. Comparatively great bending or warping, which can lead to handling problems, particularly in the edge regions of the substrate, can be equalized in this manner.

Simple design conditions can result if the recess having the seal and at least one recess connected with the holding means in terms of flow run concentrically. Furthermore, production of such an apparatus can be carried out in comparatively simple manner, so that a cost-advantageous apparatus can be created.

In a simple design, the seal is connected with the bottom of the recess with a firm bond. In particular, it can be avoided, by means of this set-back of the connection means, that these cannot lead to any damage of the substrate. A particularly safe apparatus can thereby be created.

If the seal, which runs conically in cross-section, has two equal bending shanks, a tilting movement that is free in the tilting direction can be made possible. In this way, depending on the progression of the substrate, a tilting movement in the one tilting direction or a tilting direction opposite to it can be performed, and this can increase the universal usability of the apparatus for the most varied substrates.

If the seal is structured as a tubular seal, then the deformability of the seal can furthermore be utilized to ensure low stress on the substrate. Furthermore, in this way the dimensions of the recess for the seal can be kept low and thereby a cost advantage in production can be made possible.

In order to securely fasten comparatively large substrates, including their warping, on the apparatus, or to compensate for their geometric deviations, the support can have multiple recesses having seals, which separate the support into multiple supporting surface portions. In a simple design, these recesses can run offset radially from one another. Further recesses that are jointly connected with a holding means, in terms of flow, can be provided between these recesses having seals.

If at least one recess of a supporting surface portion is connected with the holding means, in terms of flow, separately from the other recesses, then different suction pressures can be introduced between support and substrate, for example, in such a manner that particularly gentle straightening of the substrate can be made possible in this way. Advantageous drawing of the substrates to flatten or align them can therefore occur even in the case of severely warped or bent substrates.

BRIEF DESCRIPTION OF THE DRAWING

In the figures, the object of the invention is shown as an example, using multiple exemplary embodiments. The drawings show.

WAY TO IMPLEMENT THE INVENTION

Figure 1:
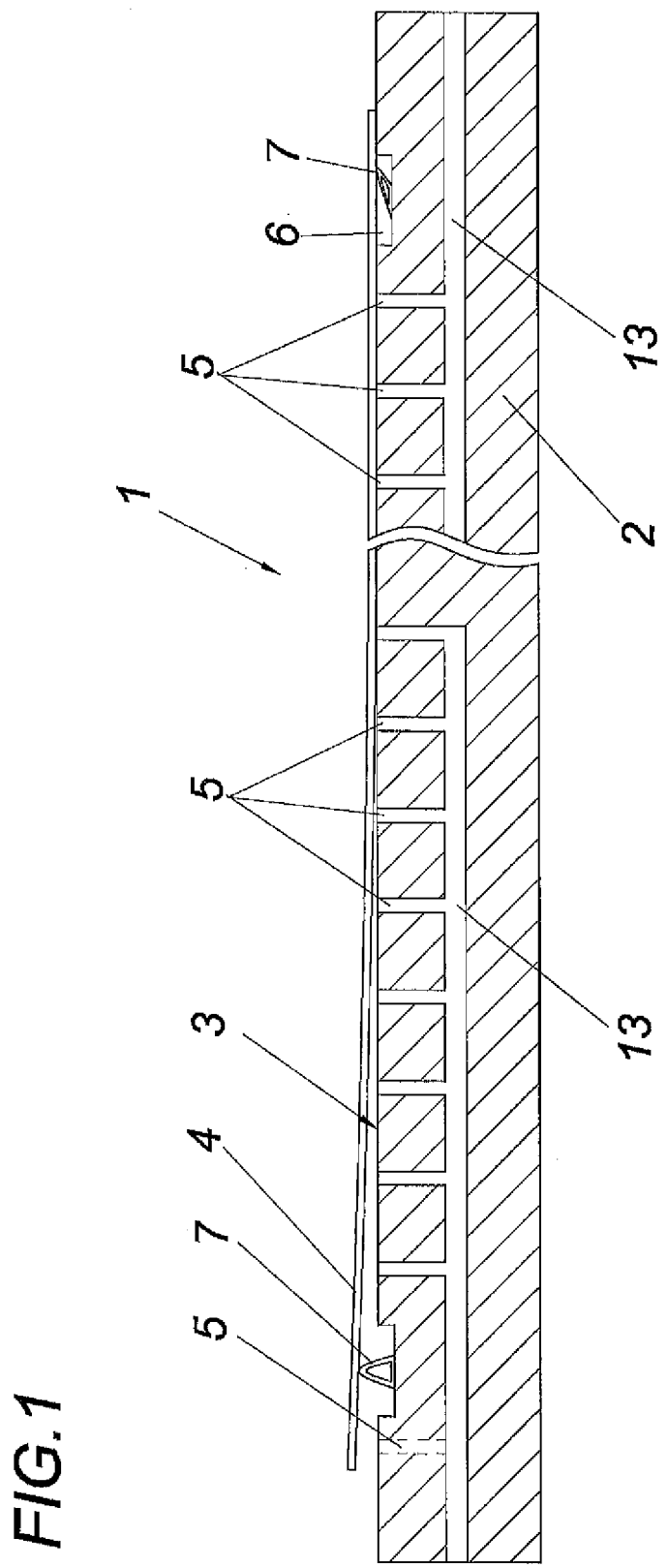
FIG. 1 a side view of a first apparatus with substrate in a sectional view.
Figure 2:
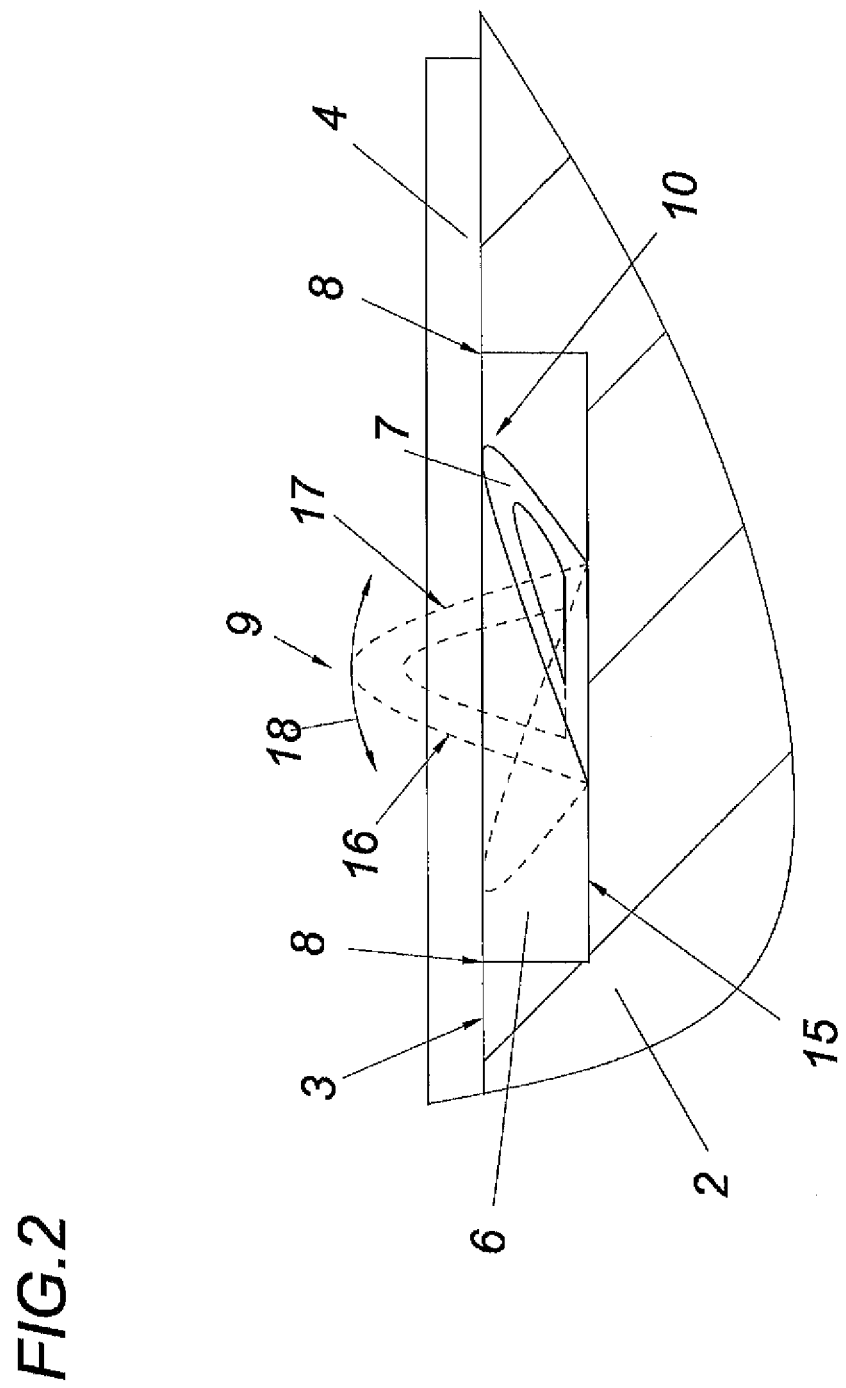
FIG. 2 an enlarged detail view of FIG. 1.

The apparatus 1 shown according to FIG. 1, for example, has a support 2 that forms a supporting surface 3 for a planar substrate 4, particularly an eWLB. As can be seen in FIG. 1, the substrate 4 is spherically bent and therefore touches the supporting surface 3 only in part. In order to now fasten the substrate 4 onto the apparatus or to bring it into a desired expanse, the support 2 has recesses 5 that are connected, in terms of flow, with a partial vacuum line 13 of holding means not shown in any detail otherwise, to generate a partial vacuum. In this way, the substrate 4 can be drawn against the support surface 3 and fastened in place, and thereby a shape of the substrate 4 that possibly deviates from the desired shape is adapted to the progression of the supporting surface 3. However, in order to be able to accommodate, fasten or flatten even comparatively great spherical bending (concave and/or convex formation), the support 2 has a further recess 6, in addition to the recess 5, having an elastic seal 7. In this way, a gas-tight connection of the support 2 and the substrate 4 is guaranteed, so that the substrate 4 can be drawn onto the support 2 by suction, using a partial vacuum. However, the special thing about this seal 7 is that this seal 7 is configured so that it can be moved from a position 9 projecting beyond the edge 8 of the recess 6 into a position 9 pulled back in relation to the edge 8 of the recess 6 or a position 10 at most equal to this edge 8. The different positions 9 and 10 can particularly be seen in FIG. 2. By means of this pulling-back seal 7, stresses of the substrate 4 when drawing this substrate 4 against the supporting surface 3 can now be ignored, and this can create an apparatus that not only works with particular tolerance to bending (bow), waviness (warp), deviations in levelness (flatness), and thickness deviations (Total Thickness Variation) of the substrate, but also has a comparatively low risk of damage to the substrate. The apparatus according to the invention is therefore particularly suitable for comparatively greatly warped or bent substrates, to hold them securely, on the one hand, and, on the other hand, to straighten them into a desired geometrical shape, because this recess 6 works together with the recess 5 in order to allow drawing the substrate 4 onto the support 2 by suction, over its full area.

The elastic seal 7 is passively moved when the substrate 4 is drawn against the supporting surface 3, so that the substrate 4 elastically deforms the seal 7. In this way, it is possible to do without further design measures for pulling back the seal 7, and this makes it possible to create a cost-advantageous apparatus 1.

The recesses 5 are disposed distributed over the support 2, and this not only makes the suction pressure uniform but also ensures drawing-in, by suction, over the full area.

Figure 3:
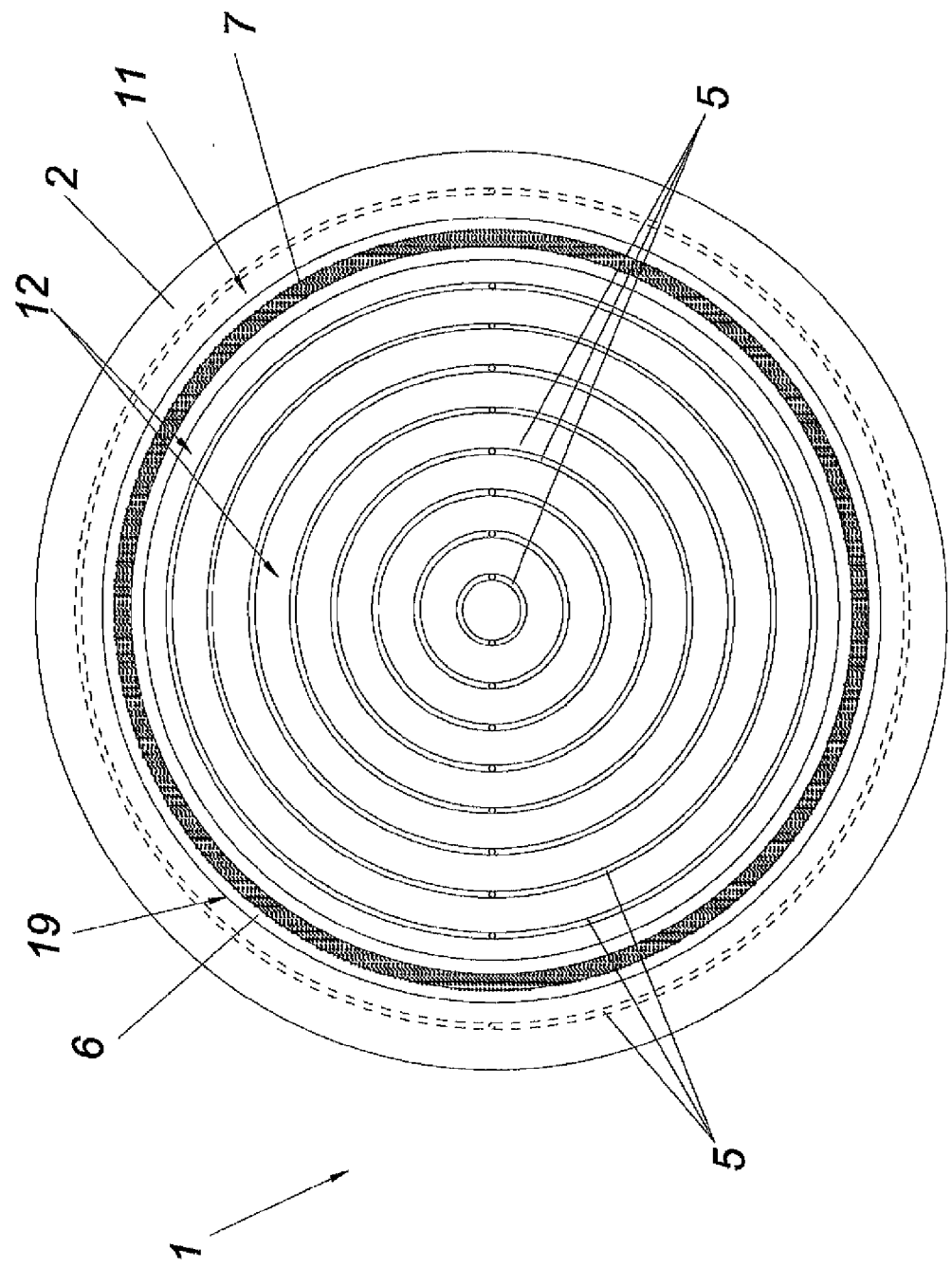
FIG. 3 a top view of the apparatus according to FIG. 1 without substrate.

According to FIG. 3, it can be seen that the seal 7 completely surrounds the recess 5 of the support 2 that has a partial vacuum, and thereby forms a closed contour progression 19. In this way, a particularly gas-tight connection between apparatus 1 and substrate 4 can be created. Furthermore, the tolerance of the apparatus 1 for geometrical deviations of the substrate 4 can be increased even further in this way.

Particular planarity of the fastened-on substrate 4 even in the edge region of the substrate 4 can be created if the recess for the seal 7 follows an edge-side supporting surface portion 11. Because the seal thereby separates the supporting surface 3 into at least two supporting surface portions 11 and 12, the outer supporting surface 11 can improve drawing of the substrate onto the supporting surface 3, also as a floating bearing.

The recesses 5 and 6 run concentrically. The seal 7 is structured for great deformability, as a tubular seal, and connected with the bottom 15 of the recess 6 with a firm bond, particularly glued to it. In this way, a conical cross-section progression of the seal 7 occurs, which can perform a free tilting movement 18 with its two shanks 16 and 17, which movement can be in the one or in the other tilting direction, depending on the substrate to be accommodated. In this way, the apparatus 1 is particularly tolerant to substrates 4 deformed in different ways.

Figure 4:
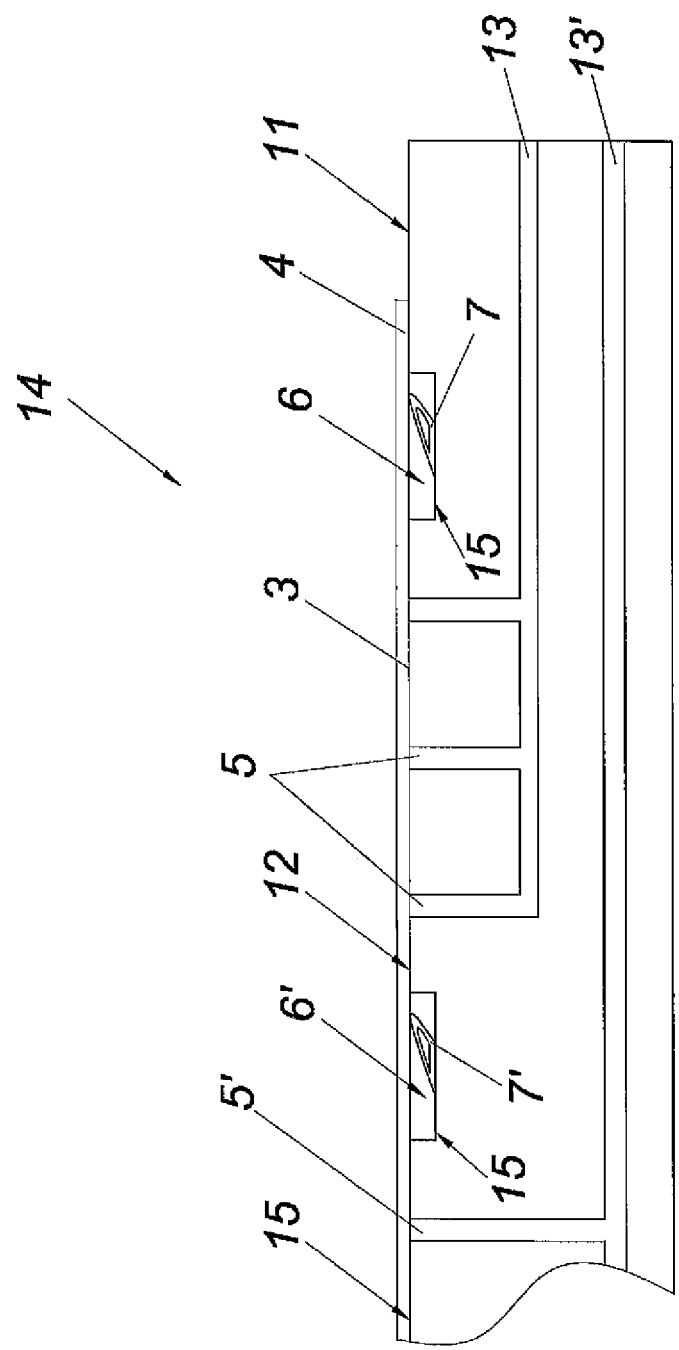
FIG. 4 a cut-off sectional view of a further apparatus for holding a substrate.

For larger substrates 4, the support 2 can have multiple recesses 6 having seals 7, which recesses are offset radially from one another, as has been shown in greater detail in FIG. 4. In this way, multiple supporting surface portions 11, 12, and 14 can be created. It is advantageous if the recesses 6, 6' run radially offset relative to one another.

The recesses 5' are connected with the holding means, in terms of flow, by way of a separate partial vacuum line. In this way, recesses 5, 5' to which different partial vacuum conditions can be applied can also be provided between the recesses 6, 6' having seals 7, 7'. Comparatively gentle holding and/or straightening of substrates 4 can thereby be adjusted or guaranteed.

The invention claimed is:

1. Apparatus for holding a planar substrate, having a support that forms a supporting surface for the substrate, which has at least one supporting surface recess provided in the region of the supporting surface for the substrate, and having at least one holder connected with this supporting surface recess, in terms of flow, for fastening the substrate onto the apparatus, using a partial vacuum generated between the support and the substrate, wherein the support has at least one support recess having an elastic seal configured to be moveable from a position projecting beyond the edge of the support recess into a position agreeing with the edge support of the support recess, the elastic seal working together with the supporting surface recess to draw the substrate against the support over a full area of the substrate, by suction, wherein the elastic seal runs conically in cross-section, is free in a tilting direction, has two equal bending shanks in order to allow a tilting movement of the elastic seal, and is structured as a tubular seal.

2. Apparatus according to claim 1, wherein the elastic seal is configured to be passively moved by the substrate.

3. Apparatus according to claim 1, wherein the supporting surface recesses are disposed distributed over the support.

4. Apparatus according to claim 1, wherein the support recess forms a closed contour progression.

5. Apparatus according to claim 1, wherein the elastic seal essentially surrounds the supporting surface recess.

6. Apparatus according to claim 1, wherein the support recess divides the supporting surface into two supporting surface portions.

7. Apparatus according to claim 6, wherein the support recess follows an edge-side supporting surface portion.

8. Apparatus according to claim 1, wherein the support recess and the supporting surface recess run concentrically.

9. Apparatus according to claim 1, wherein the elastic seal is connected with the bottom of the support recess with a firm bond.

10. Apparatus according to claim 1, wherein the support has multiple support recesses having elastic seals, which divide the support into multiple supporting surface portions, which support recesses run offset form one another.

11. Apparatus according to claim 10, wherein the multiple supporting surface portions each have a supporting surface recess, and wherein the supporting recess of a first supporting surface portion is connected with the holder, in terms of flow, separately from the supporting surface recesses of the other supporting surface portions.

12. Apparatus according to claim 1, wherein the elastic seal is configured to be moveable from a position projecting beyond the edge of the support recess into a position pulled back in relation to the edge of the support recess.

13. Apparatus according to claim 1, wherein the elastic seal completely surrounds the supporting surface recess.

14. Apparatus according to claim 1, wherein the substrate is configured to support a wafer and/or eWLB.

15. Apparatus according to claim 10, wherein the support recesses run radially offset from one another.

* * * * *